(12) United States Patent
Lu et al.

(10) Patent No.: US 6,294,731 B1
(45) Date of Patent: Sep. 25, 2001

(54) APPARATUS FOR MULTICHIP PACKAGING

(75) Inventors: Dau-Tsuong Lu; John T. Keating, both of Clifton Park, NY (US)

(73) Assignee: Performance Interconnect, Inc., Schenectady, NY (US)

( * ) Notice: Subject to any disclaimer, the term of this patent is extended or adjusted under 35 U.S.C. 154(b) by 0 days.

(21) Appl. No.: 09/526,384

(22) Filed: Mar. 16, 2000

Related U.S. Application Data
(60) Provisional application No. 60/124,657, filed on Mar. 16, 1999.

(51) Int. Cl.[7] .................................................. H05K 9/00
(52) U.S. Cl. ..................... 174/35 R; 174/52.2; 174/52.4; 439/66; 439/607; 361/816; 361/717; 361/718; 257/712; 257/713; 257/660
(58) Field of Search .......................... 174/35 R, 35 MS, 174/52.2, 52.4; 361/816, 818, 717, 718; 439/66, 607; 257/712, 713, 660

(56) References Cited

U.S. PATENT DOCUMENTS

| 3,638,163 | 1/1972 | Loosme | 439/74 |
|---|---|---|---|
| 3,985,413 | 10/1976 | Evans | 439/66 |
| 4,655,462 | 4/1987 | Balsells | 267/167 |
| 5,007,842 | 4/1991 | Deak et al. | 439/66 |
| 5,030,109 | 7/1991 | Dery | 439/66 |
| 5,123,849 | 6/1992 | Deak et al. | 439/66 |

OTHER PUBLICATIONS

D.G. Grabbe and H. Merkelo, "Micro Interposer" AMP Journal of Technology, vol. 1, Nov., 1991.

Primary Examiner—Dean A. Reichard
Assistant Examiner—Hung V Ngo
(74) Attorney, Agent, or Firm—Salzman & Levy

(57) ABSTRACT

The present invention comprises a high performance single chip or multi-chip package which combines a CTE controlled electronic substrate, a multi-layer interconnect, bare dice or packaged devices, a top layer encapsulant and an interposer to provide a compliant and de-mountable connection to a printed circuit board. The CTE controlled electronic substrate comprises a metal or composite shell around an encapsulated core holding vertical electrical conductors. The vertical connection comprises an array of stranded or braided electrical conductors which may be exposed on the top and or bottom of the electronic substrate to provide a de-mountable interface. An interconnect layer may be attached to the planar CTE controlled electronic substrate using an adhesive or polymer. Following the connection of the interconnect to the substrate, the bare dice and/or package may be attached to the interconnect.

21 Claims, 8 Drawing Sheets

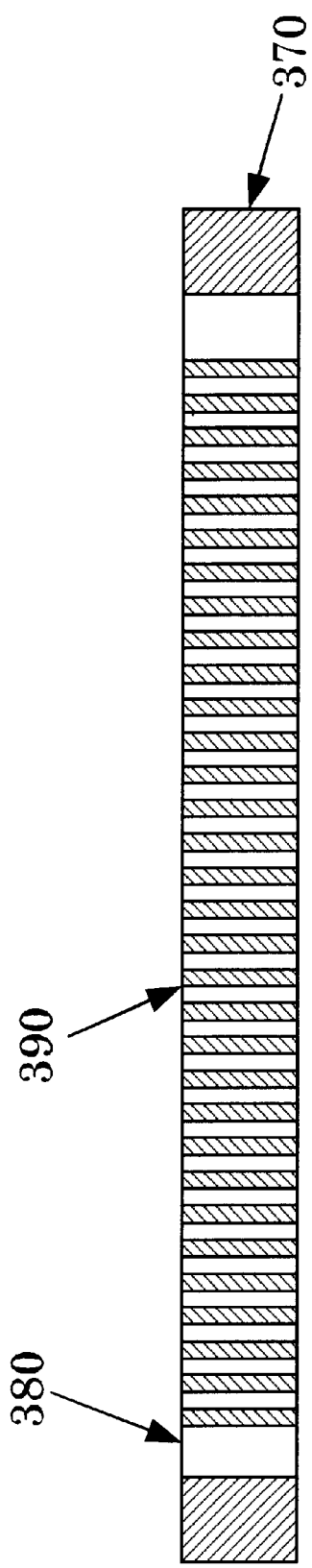
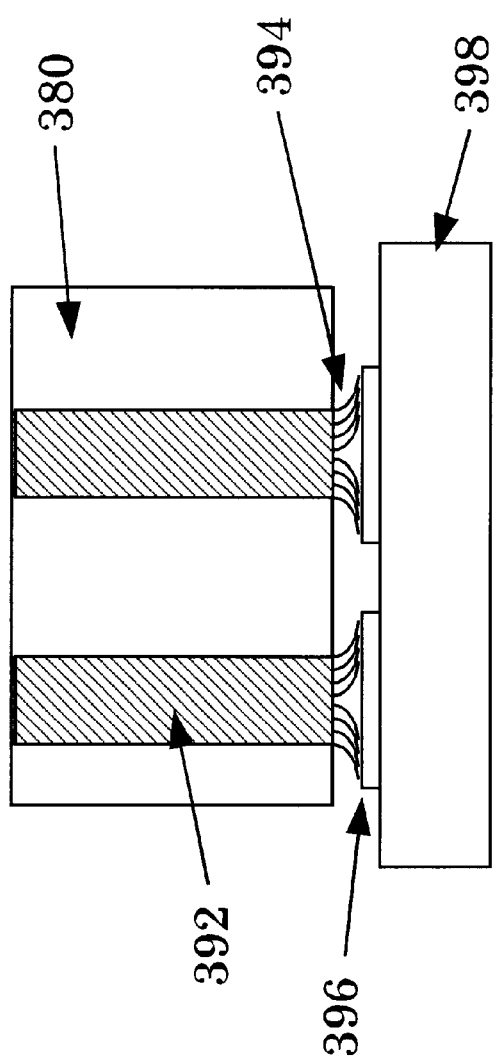

APPARATUS FOR MULTICHIP PACKAGING

PRIORITY

This application claims priority from Provisional Application Ser. No. 60/124,657, filed Mar. 16, 1999.

FIELD OF THE INVENTION

The present invention relates to the field of semiconductor packaging, particularly to multi-chip semiconductor packaging.

BACKGROUND OF THE INVENTION

Throughout the 1970s and 1980s semiconductor packaging was relatively stable, with changes occurring gradually over periods of five to ten years. The U.S. military was the major technology driver—controlling standards, testing and managing change. During the 1970s, one major focus in packaging was in cost reduction—producing a semiconductor package at lower cost. From 1984 to through 1994, change was gradual, the largest change being a gradual transition to surface mount technology (SMT). Over that ten year period, approximately 50% of the industry converted to SMT, which illustrated how slowly new technologies may be introduced into electronics packaging.

However, with the growth of the consumer and industrial electronics industry and the simultaneous decline of the military market, rapid changes have occurred in the electronics industry. As a result, the U.S. electronics market may be starting to operate much like the Japanese consumer electronics market—with higher pressures to reduce costs and shrink packaging size.

To meet such demands, integrated circuit (IC) manufacturers have begun integrating more circuit functions, shrinking device features, and increasing speeds. From a packaging perspective, smaller form factors, requirements for more input/output signals and power management all became major technology drivers. System level needs included the transition to SMT and use of finer featured packages. Sophisticated new products of all types began developing, and soon barriers were reached with conventional packages and processes.

Conventional package leads may be deemed too fine and fragile, and surface mounting processes have not proved to be robust enough to provide acceptable yields. The 208-lead Plastic Quad Flat Package (QFP), illustrated in FIG. 8, became the appropriate practical limit for peripheral leaded packages—and the transition to grid array packages began.

To further enable compatibility with surface mount technology (SMT) process, solder balls were attached at the bottom of land grid array packages, forming the Ball Grid Array (BGA), illustrated in FIG. 9. The BGA package allows for much greater I/O counts while eliminating the fragile and difficult aspects of the conventional QFP.

A number of derivatives of the BGA (e.g., FPGA, $\mu$BGA, or he like) are in existence today. The BGA package comprises a ceramic substrate with a multi-layer interconnect. On the top of the package, a single die or multiple dice may be attached by wire bond or flip-chip to the substrate. The bottom of the package comprises of an array of solder balls with diameters ranging from 0.4 mm and higher.

For improved reliability, an under-fill maybe used to fill the space between the solder balls following solder attach of the BGA package. A number of variants of the BGA structure may be based on the use of different substrate material including ceramic in CBGA, plastic encapsulated FR-4 in PBGA and flexible circuits in FBGA.

BGA packages were first designed by Motorola to solve space constraint problems in portable communications products. Motorola initially used a 2 layer PCB as a package substrate and in manufacturing, used conventional die attach, bonding, molding and solderball attach. Such a design provided a robust yet small footprint package, used to package lower I/O communications chips.

Soon others manufacturers tested packages in higher pin count applications. It quickly became apparent that BGAs could enable cost effective high I/O packages without causing major manufacturing changes for users. In fact, the BGAs were so robust most users report a 10× or greater reduction in solder defects. BGAs enabled great improvements in users manufacturing efficiencies and corresponding cost reductions. BGAs also provided superior electrical performance, as electrical paths were shorter and power/ground planes could be added to the package.

Although BGA structures have inherent high yield assembly, the long term reliability of the interconnect may be compromised without the use of under-fill. Also, these packages are associated with perimeter array contacts which have potentially greater parasitics which may degrade the electrical performance of high clock rate applications.

For package de-mountability, a number of area array interposers/electronic connectors have been developed, and are described below. Each of the approaches uses an area array configuration to form an electrical connection between two parallel substrates which may be clamped or secured together. This connector type can be traced back to July of 1970, with U.S. Pat. No. 3,638,163. Subsequent developments used metallized and metal filled elastomeric cylinders within an array as described in U.S. Pat. No. 3,985,413.

AMP has developed the Micro Interposer™ that is based upon an area array separable socket-connector constructed with the aid of a miniature structure which resembles the shape of an omega. The Micro Interposer™ uses a retaining housing and when compressed into its contacting position, provides low resistance contacts. The Micro Interposer™ is formed by inserting the contacts into cavities formed in photo-defined laminates. Further details of the Micro Interposer™ are disclosed in *AMP Journal of Technology*, Vol. November 1, 1991 (D. G. Grabbe and H. Merkelo), incorporated herein by references.

Another concept developed by AMP uses canted coiled spring contacts positioned in openings within the connector to provide electrical contact between the two intended substrates. In U.S. Pat. Nos. 5,007,842 and 5,030,109 both of which are incorporated herein by reference, the above approach describes the coiled spring contact. This coiled spring contact approach is also disclosed in an earlier U.S. Pat. No. 4,655,462, incorporated herein by reference, which also used canted springs between parallel substrates.

Another concept developed by AMP uses a conductive gel inserted into cavities within an elastomeric body again to form interconnections between two parallel substrates. The structure, described in U.S. Pat. No. 5,123,849 incorporated herein by reference, illustrates how this area array connector could be used to interface an active component to an interconnect substrate.

Through use of miniature springs, E-tec Interconnect has developed an interposer/socket technology for area array devices. The springs may be compressed between two mating members within a fiberglass laminate structure with drilled holes for the vertical interconnect assembly. The solder-less version of their product line has many characteristics of an interposer.

The minimum possible pitch on the E-tec interconnect devices approaches 1 mm with an insertion force of approximately 35 grams per contact. This technology has been used as an area array socket due to its overall size and thickness. In addition, the high cost and no viable path to high volume manufacturing has limited to impact of the technology.

The semiconductor industry, in conjunction with several technical committees and associations have developed road maps for development of next generation products and associated technologies. Industries such as computing, communications and portable electronics have been driving these requirements and the associated road maps.

As an extension of the semiconductor industry, the electronics packaging industry has also witnessed similar technological and market dynamics. Packaging and materials engineering and development are at the very core of these next generation electronics insertion strategies outlined in these road maps. Future electronic systems may be more intelligent, have higher density, use less power, operate at higher speed, and may include mixed technology devices and assembly structures at lower cost than today.

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

Current packaging suppliers are struggling to accommodate the high speed computer devices which are projected to exceed one GigaHertz (GHz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

Current approaches to package advanced processors are based upon using discretely packaged components on an interconnect substrate to complete the processor-cache function. However, the parasitics associated with each of the packages and the board level interconnections reduces the potential clocking speed and the performance of the processor module.

In an attempt to combat this speed limitation, semiconductor manufacturers have integrated the level 2 cache into the processor die itself. This approach also has limitations, since the amount of cache memory which can be integrated may be constrained by the overall size of the die and the associated cost of a much larger semiconductor device. The limited size of semiconductor-based level 2 cache has a profound impact on the performance gain experienced by limiting the benefit of increased system DRAM memory.

Thermal performance of present and future generation processors will greatly impact the lifetime, functionality and performance of the system. As transistor geometries continue to shrink, the associated heat flux density and power generated in the semiconductor continue to grow exponentially with the square of the clock frequency.

There have been a number of claims by Intel and other semiconductor manufacturers that their warranties would be voided should the designed thermal solution be altered in any way. The above challenges underline the need for an efficient thermal path between the die and the ambient environment.

As semiconductors continue to increase in switching rates and products increase in feature and component density, the concern for EMI protection within the product and to the environment may be enhanced. The magnitude of EMI radiation may be related to the interconnect length between active components distributed on the substrate. Many approaches have been developed to shield problem components. These approaches include discrete metal shields and metallized enclosures, but may be costly and involve an iterative design process for evolving form factors and device types. Inherent package shielding may be necessary for next generation processors and microelectronic applications.

A major problem facing the implementation of Ball Grid Array (BGA) packages is the reliability of the solder-based connection. The primary failure mechanism may be cracked balls due to stress incurred by the Coefficient of Thermal Expansion (CTE) mismatches between the package and the board. Studies have shown that the standoff height of a large ball offers a measure of compliance that increases overall reliability.

As pin counts increase and package sizes decrease, the industry will be forced to move to finer pitch arrays and smaller balls which may be less reliable. The use of underfill has reduced some of these concerns, but the re-workability of an under-filled component may be poor at best. This problem has motivated many companies to investigate a de-mountable assembly technology.

Traditionally, Multi-Chip Modules (MCMs) have been defined as any package with more than a single semiconductor device. Today, there is a new paradigm, only those packages with high die count (e.g., ten or more) using complex processes may be considered MCMs. The industry has adopted the Multi-Chip Package (MCP) as the means to achieve high levels of functional integration. An MCP may be defined generally as a multi-chip package with fewer than ten devices.

These fewer chip packages (MCPs) offer many of the benefits of MCMs, but utilize standard processes and materials to complete the package. One of the downsides to the use of MCMs may be the impact of non-yielding semiconductors on first-pass yield and subsequent rework. One motive for using MCPs may be the exponential cost of further wafer scale integration and Systems On a Chip (SOC).

The use of MCPs allows a semiconductor manufacturer to partition an overall function into smaller more testable and higher yielding devices which may be integrated into a single package. The microprocessor industry is a perfect example, as there have been great efforts to integrate features such as Level 2 cache into the processor die itself. Such integration efforts have not been completely addressed through using MCPs. However, the use of fewer devices increases the first pass yield and reduces overall cost. Regardless, there is a need for improved partial and full speed testability for both MCMs and MCPs.

The development of a novel packaging technology for the commercial microprocessor market may enable GigaHertz processors to be manufactured at a low cost. The ability of the packaging technology to allow high speed communications in a reliable fashion between a separate cache and microprocessor may eliminate the need for on-die cache and provide a path for lower cost microprocessors.

The need for an extremely large and typically low yield microprocessor die may be mitigated with this new packaging technology. Furthermore, the future road map for GigaHertz processors may be directed towards a de-centralized approach whereby the high speed interconnect, a very reliable package for multiple die, and excellent thermal and EMI package characteristics may allow for low cost commercial GigaHertz personal computers.

SUMMARY OF THE INVENTION

The present invention comprises a high performance single chip or multi-chip package that combines a Coefficient of Thermal Expansion (CTE) controlled electronic substrate, a multi-layer interconnect, bare dice or packaged devices, a top layer encapsulant and an interposer to provide a compliant and de-mountable connection to a printed circuit board.

The Coefficient of Thermal Expansion (CTE) controlled electronic substrate comprises a metal or composite shell around an encapsulated core holding vertical electrical conductors. The vertical connection comprises an array of stranded or braided electrical conductors which may be exposed on the top and or bottom of the electronic substrate to provide a de-mountable interface.

An interconnect layer may be attached to the planar CTE controlled electronic substrate using an adhesive or polymer (e.g., Z-axis anisotropic adhesive, conductive epoxies, or the like). Following the connection of the interconnect to the substrate, the bare dice and/or packaged are attached to the interconnect.

A number of approaches such as wire-bonding, flip-chip, BGA and SMT may be used for connection to the interconnect. For all assembly approaches, a thermally conductive shim may be attached to the device to provide good heat transfer through the metal/composite shell.

The Coefficient of Thermal Expansion (CTE) of the electronic substrate may be tailored to provide a good match to the attached components to ensure excellent reliability for the assembly of devices, interconnect, and electronic substrate. A thermally conductive encapsulant may be used to coat the components. A planar encapsulated surface may result with the thermally conductive shims exposed. Finally, a metal film may be applied or deposited and may provide a thermal path to the metal or composite shell of the electronic substrate.

The de-mountability of the electronic assembly may be achieved by exploiting the flexibility of the array of compliant vertical conductors of the electronic substrate. First, a selective etch may be performed to expose a predetermined length of the vertical conductor from the encapsulated core of the electronic substrate. This predetermined length may be calculated based upon the number of vertical conductors, material properties of the conductors, and size and material properties of the electronic substrates.

The exposed array of conductors may form a flexible and de-mountable electrical connection from this novel electronic package to a printed circuit board. A compressive mechanical assembly will be required to provide continuous connectivity between the novel electronic package and the printed circuit board.

It is therefor an object of the invention to provide a multichip packaging structure having control of the coefficient of thermal expansion.

It is a further object of the invention to provide a multichip package with a conformable interface structure.

It is yet another object of the invention to provide a multichip packaging structure having a built-in thermally conductive ship to transfer heat from an electrical device to a thermally conductive case.

It is a still further object of the invention to provide a multichip packaging structure having an array of a combination of flexible stranded, braided or solid flexible interface conductors.

It is an additional object of the invention to provide a multichip packaging structure wherein the flexible interface conductors may be of different diameters.

It is yet another object of the invention to provide a multichip packaging structure having a core of polymeric material surrounding an array of flexible interface conductors.

It is a still further object of the invention to provide a multichip packaging structure wherein a core of polymeric material surrounding an array of flexible interface conductors is surrounded by a thermally conductive core.

It is another object of the invention to provide a multichip packaging structure wherein a package cover is adapted to provide EMI shielding.

It is yet a further object of the invention to provide a multichip packaging structure having an EMI shielding structure electrically connected to an external connection and space a predetermined distance from a package cover so that inductance and capacitance may be optimized to insure reliable electrical operation.

BRIEF DESCRIPTION OF THE DRAWINGS

A complete understanding of the present invention may be obtained by reference to the accompanying drawings, when considered in conjunction with the subsequent detailed description, in which:

FIG. 3 is a cross-section view and an enlarged cross-section view of the array of exposed conductors of FIGS. 1 and 2, illustrating how an exposed portion of each conductor contacts a recipient substrate or board;

FIG. 3a is an enlarged portion of the cross-section view of the array of exposed conductors shown in FIG. 3;

DETAILED DESCRIPTION OF THE PREFERRED EMBODIMENT

Figure 1:
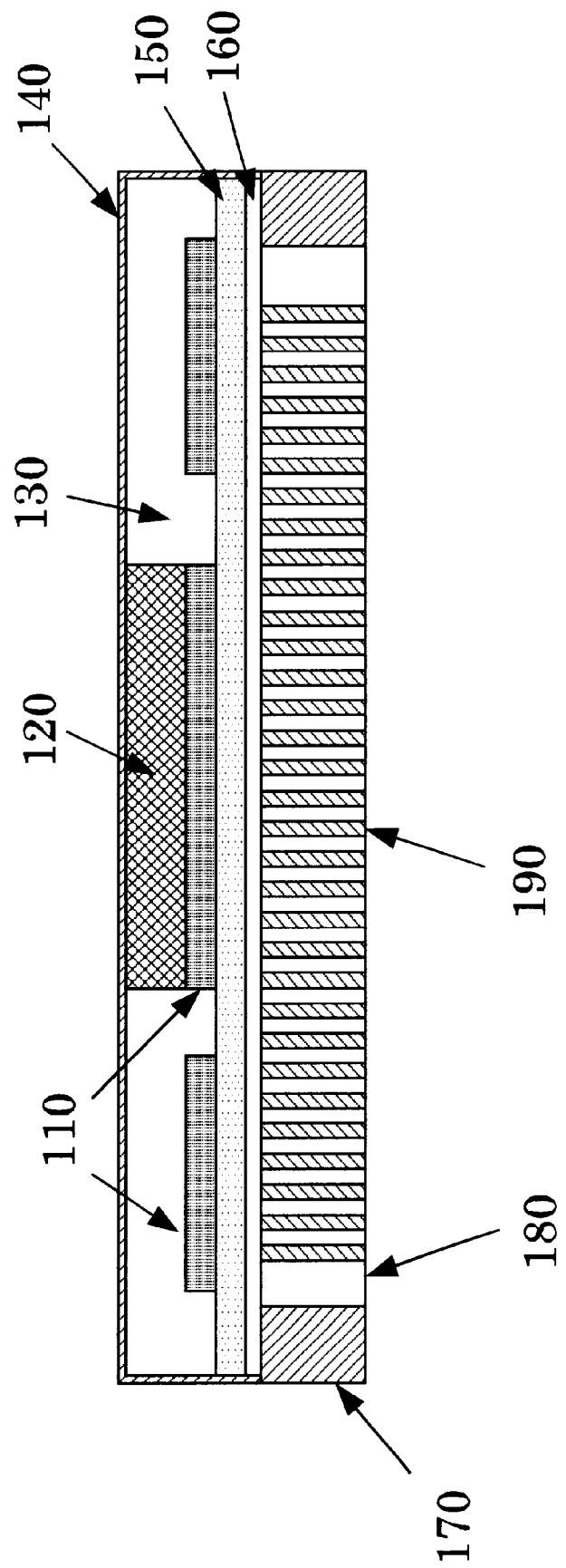
FIG. 1 is a cross-section view of an embodiment of the present invention.
Figure 2:
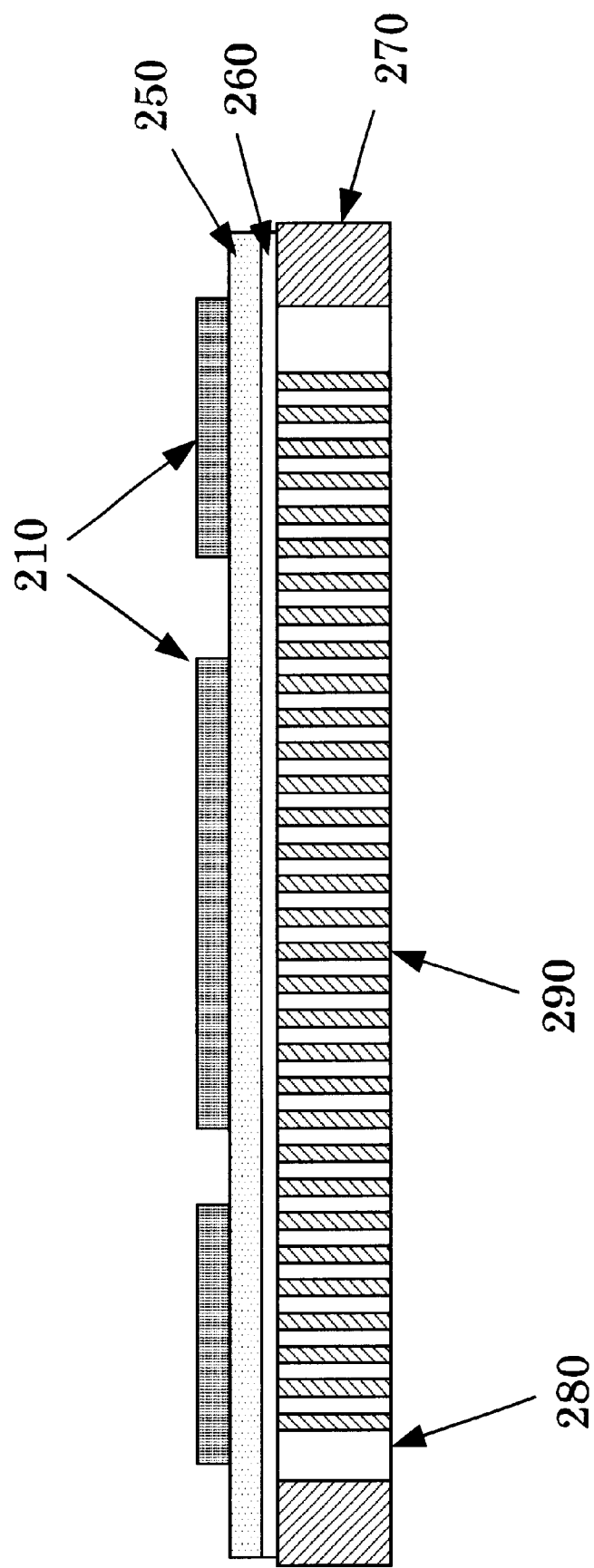
FIG. 2 is a cross-section view of the CTE controlled electronic substrate of FIG. 1.

Description of the presentation invention is provided in conjunction with the accompanying drawings wherein like elements of each FIGURE are labeled with similar reference numerals having different prefixes (e.g., element 110 of FIG. 1 is analogous to element 210 of FIG. 2, and so on).

Referring first to FIG. 1, there is shown a first embodiment of the present invention comprising a high performance single chip or multi-chip package. The inventive package combines a Coefficient of Thermal Expansion (CTE) controlled electronic substrate with a multi-layer interconnect 150, bare dice or packaged device 110, and a top layer encapsulant 130 to provide a compliant and de-mountable connection to a printed circuit board.

The CTE controlled electronic substrate comprises a metal or composite shell 170 around an encapsulated core 180 holding vertical electrical conductors 190. The vertical connection comprises an array of stranded or braided electrical conductors 190 which may be exposed on the top and or bottom of CTE controlled electronic substrate to provide a de-mountable interface.

Interconnect layer 150 may be attached to the planar CTE controlled electronic substrate using an adhesive or polymer (e.g., Z-axis anisotropic adhesive, conductive epoxies, or the like). Because conductive epoxies can easily short circuit adjacent pins, they must be used with care. They may be applied by dabbing controlled amounts on individual to prevent short circuits. Following the connection of interconnection layer 150 to CTE controlled electronic substrate, bare dice and/or packaged components 110 may be attached to interconnect layer 150.

A number of approaches such a wire-bonding, flip-chip, BGA and SMT may be used for connection of the bare dice and/or packaged components 110 to interconnect layer 150. For all assembly approaches, a thermally conductive shim 120 may be attached to one or more of bare dice and/or packaged components 110 to provide good heat transfer through the metallized package cover 140.

The Coefficient of Thermal Expansion of the CTE controlled electronic substrate may be tailored to provide a good match to attached bare dice and/or packaged components 110 to ensure excellent reliability for the assembly of bare dice and/or packaged components 110, interconnect layer 150, and CTE controlled electronic substrate.

A thermally conductive encapsulant 130 may be used to coat bare dice and/or packaged components 110. A planar encapsulated surface may result with thermally conductive shims 120 exposed. A metal or composite film (not shown) may be applied or deposited to form a thermal path to the metallized package cover 140.

The de-mountability of the electronic assembly of FIG. 1 may be achieved by exploiting the flexibility of the array of compliant vertical conductors 190 of CTE controlled electronic substrate. First a selective etch may be performed to expose a predetermined length of the vertical conductor 190 from the encapsulated core of CTE controlled electronic substrate. This predetermined length may be calculated based upon the number of vertical conductors, material properties of the conductors, and size and material properties of the electronic substrates.

Exposed array of conductors 190 may form a flexible and de-mountable electrical connection from this novel electronic package to a printed circuit board (not shown). A comprehensive mechanical assembly including such steps as aligning the socket and clamp assembly may be required to provide continuous connectivity between the novel electronic package and the printed circuit board.

The electronic substrate structure allows for tailoring of the substrate CTE through the use of a metal or composite shell (of any shape) around a plastic core holding vertical electrical connections. A cross-section of this electronic substrate is illustrated in FIG. 2.

In FIG. 2, the vertical electronic connection comprises an array of either braided or solid conductors 290. A CTE match between CTE controlled electronic substrate 270 and bare dice and/or packaged components 210 attached to multi-layer interconnect 250 is a key element for improved package reliability. CTE tailoring is engineered by choosing appropriate materials and dimensions for CTE controlled electronic substrate 270 including a new manufacturing process for this assembly. For example, the CTE constraint walls of the substrate may be made from long, protruding metal tubes. The conductor wires may be placed through these tubes and then a polymer material may be injected into the tubes. Once the polymer has solidified, the long tube may be sliced, the slices individually polished and then etched to expose the wire ends (conductors) thereby forming individual substrates.

FIG. 3a is an enlarged view illustrating the reliable and removable electrical interface of the inventive interposer structure. Through the use of exposed stranded or braided conductors 392 embedded within a confined structure of any shape, a compliant and de-mountable connection may be made to a printed circuit board or assembly substrate 398.

As a result, stresses induced by mismatches in the CTE between the interposer and circuit board 398 may not result in a failed connection due to the compliant nature of the contact as illustrated in FIGS. 3 and 3a. This compliance allows for a low clamping force interface between the two substrates or printed circuit boards.

Still referring to FIGS. 3 and 3a, there is shown an array of exposed conductors 390 similar to those shown in FIGS. 1 and 2. For simplicity of illustration, the remaining components (dice and/or packaged components, interconnection layer, and the like) are not shown. Individual conductors such as conductor 392 are encapsulated with encapsulant 380. However, as illustrated in FIG. 3a, encapsulant 380 does not encapsulate all of the array of exposed conductors 390, but rather allows a portion of each conductor 392 to protrude as illustrated by reference numeral 394.

As described hereinabove, each of the array of exposed conductors 390 may comprise, for example, a braided conductor. When pressed against circuit board or substrate 398, the protruding exposed portion 394 of an individual conductor 392 may compress slightly onto complimentary pad 396 so as to form an electrical contact.

Figure 4:
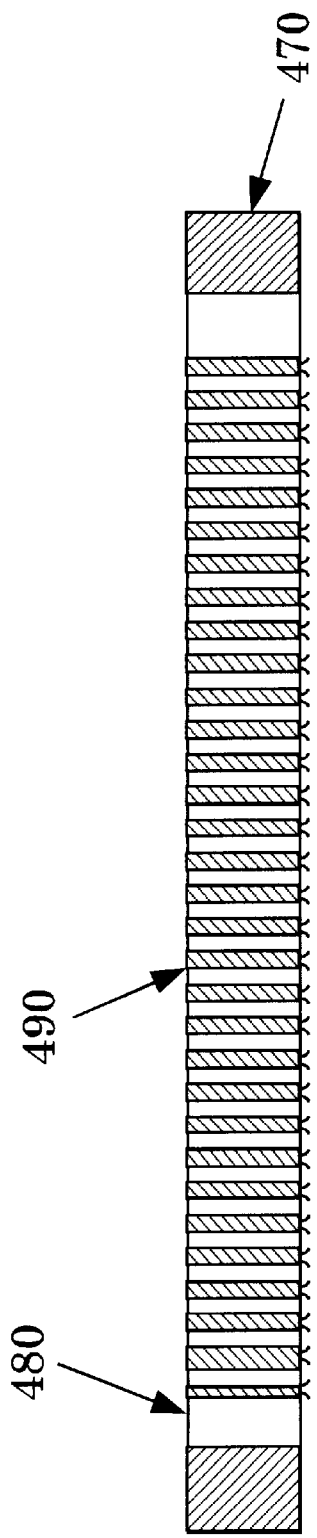
FIG. 4 illustrates an alternative embodiment where variable sized conductors may be used to provide low-parasitic power connections and signal connections between the interconnect and the board.
Figure 4A:
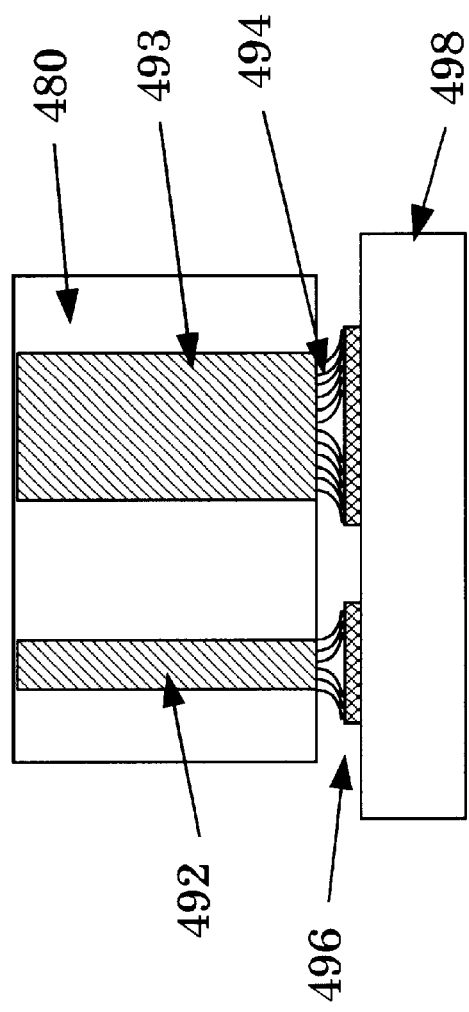
FIG. 4a is an enlarged view of the alternative embodiment with variable sized conductors shown in FIG. 4.

FIGS. 4 and 4a illustrate an alternative embodiment where variable sized conductors 493, 494 may be used to provide low-parasitic power connections and signal connections between the interconnect and the circuit board 498. Varying sized conductors 492, 493 within array of 1 exposed conductors 490 may allow for low parasitic power and tailored power delivery to active components mounted on the interconnect. The use of stranded or braided conductors offers lower skin effect resistance at high frequencies than do solid conductors. An enlarged cross-section of this structure is illustrated in FIG. 4a.

As illustrated in FIG. 4a, array of exposed conductors 490 may be partially embedded in encapsulant 480 in a similar manner to FIGS. 1, 2, and 3. However, array of exposed conductors 490 may comprise individual conductors 492, 492 of varying size. The sizes of individual conductors may be varied depending upon power loading through the corresponding conductor. The use of variable size conductors represents another significant departure from Prior Art semiconductor packaging techniques. In most Prior Art designs, each conductor is of an identical size and shape, regardless of power load to that conductor.

In the enlarged portion of FIG. 4a, conductors 492, 493 may have an exposed portion (e.g., 494) which may be compressed against a corresponding complimentary pad (e.g., 496) on a recipient substrate or circuit board 498.

Note that the use of a complimentary pad may also reduce the cost and complexity of overall construction as compared to present day socketing techniques. For example, a number of complimentary pads may be formed on a circuit board, and a clamping mechanism provided, independent of these pads, to hold the semiconductor package to the board. In contrast, present day sockets (e.g., so-called "zero insertion force" or ZIF sockets) combine electrical connections with mechanical connection, resulting in a fairly complex and expensive socket component.

Figure 5:
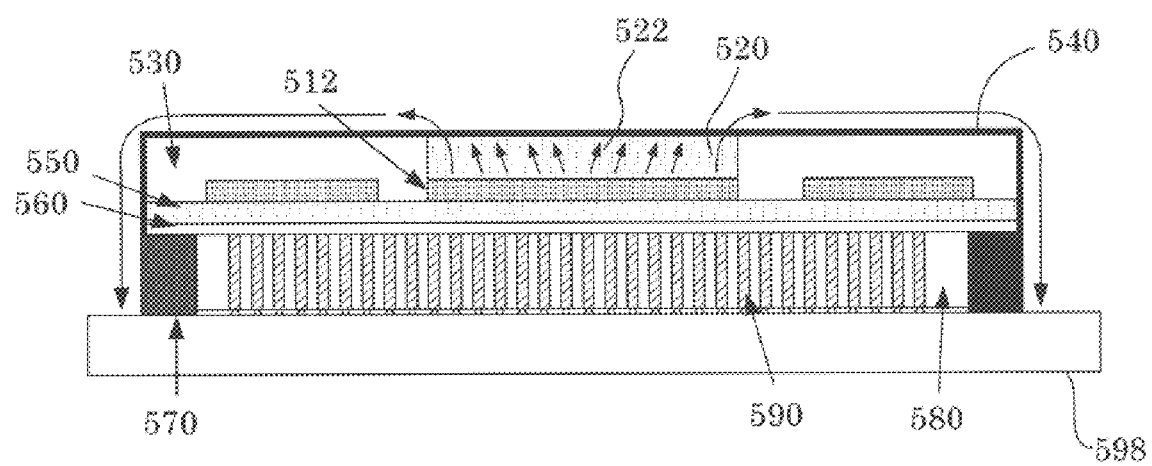
FIG. 5 illustrates the unique thermal management solution of the package structure of the present invention.

FIG. 5 illustrates another aspect of the novel package structure of the present invention—the unique thermal management solution. The unique thermal path (as illustrated by the arrows 522) for this package comprises heat transfer from a flip-chip, BGA or wire-bond attached due 512 through a thermally conductive shim 520 to the metallized package cover 540 then to the metal/composite shell 570 of the package.

This thermal solution is enhanced by the connection of the metal/composite shell 570 to printed circuit board 598 which potentially alleviates the needs for a large top-mounted heat sink.

Figure 6:
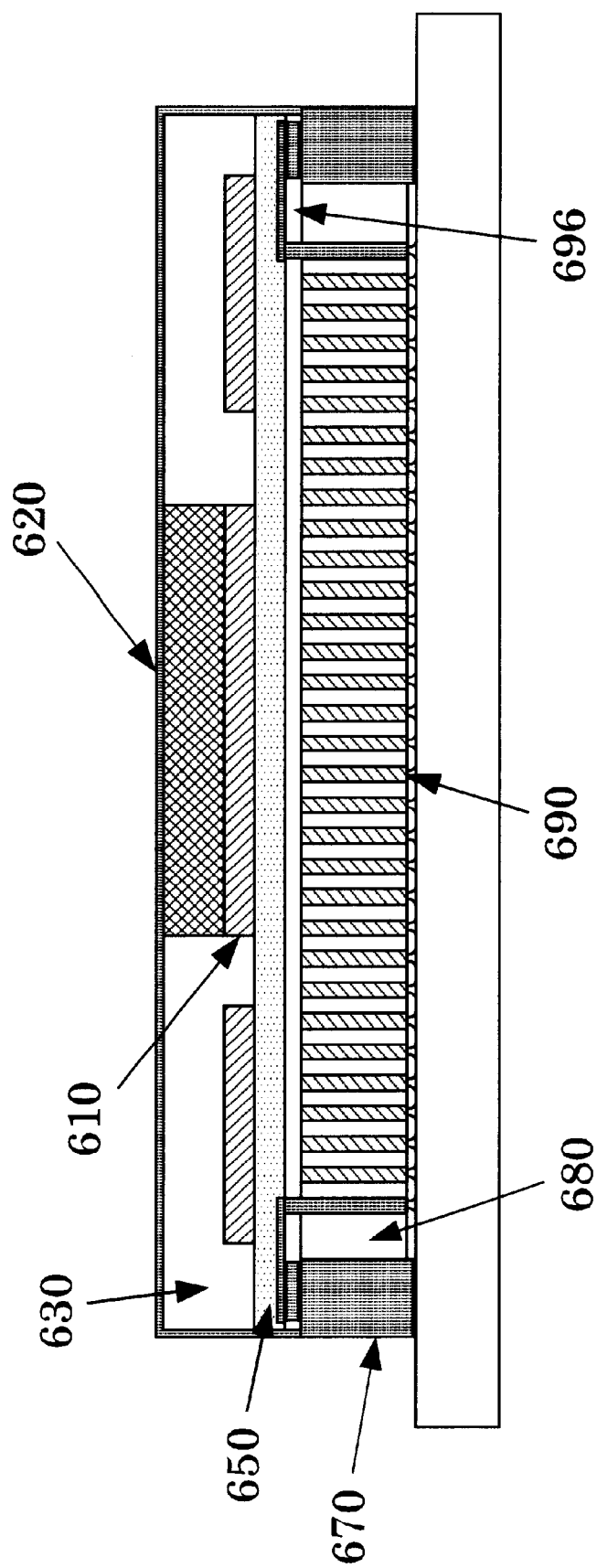
FIG. 6 is a cross-section diagram of the apparatus of the present invention illustrating the novel EMI shielding structure.

FIG. 6 is a cross-section diagram of the apparatus of the present invention illustrating the novel EMI shielding structure. EMI shielding is achieved by forming an electrical connection from one or more vertical electrical conductors 690 of the interposer to metal/composite shell 670 of the package. Electrical connectivity is established by the path from one or more vertical electrical conductors 690 to metal/composite shell 670 via interconnect layer 650 and adhesive film 696. This connectivity allows for metal/composite shell 670 to be biased to any potential thereby providing a continuous and fully enclosed EMI shield.

Figure 7:
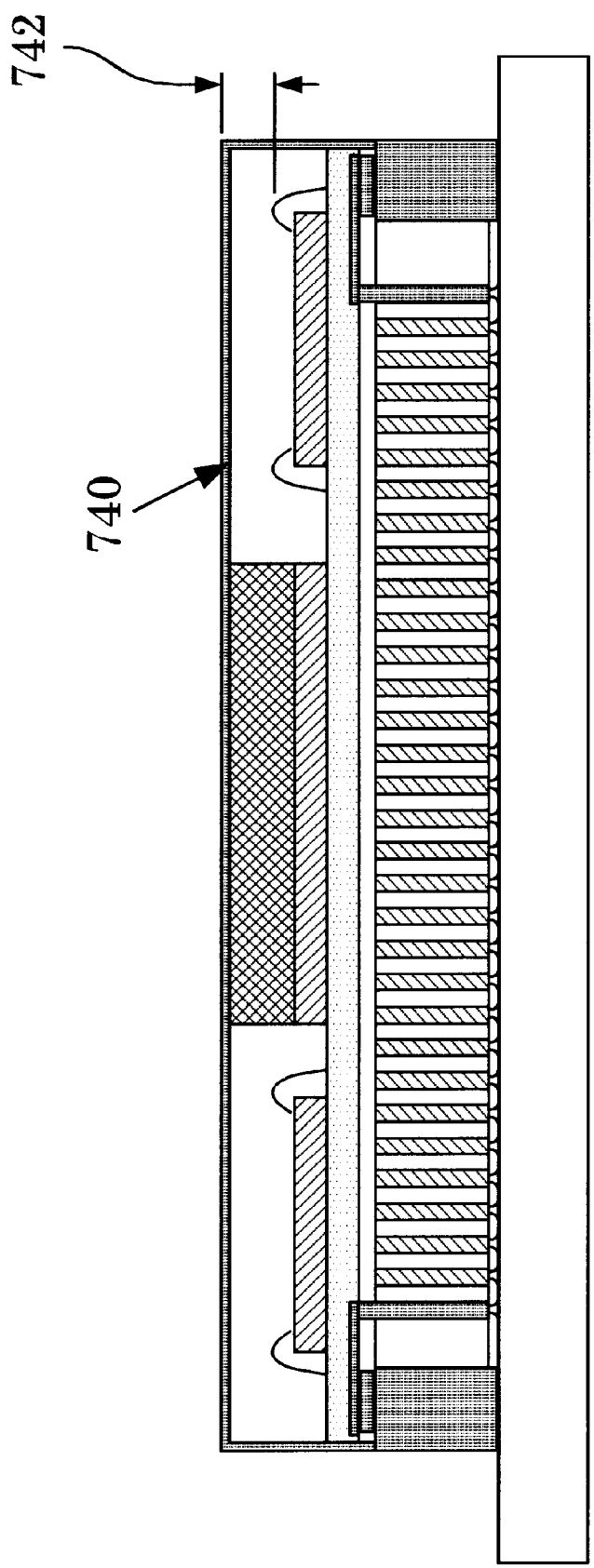
FIG. 7 is a cross-sectional view of the apparatus of the present invention illustrating the novel structure which reduces wirebond parasitics for applications utilizing wire-compatible devices.
Figure 8:
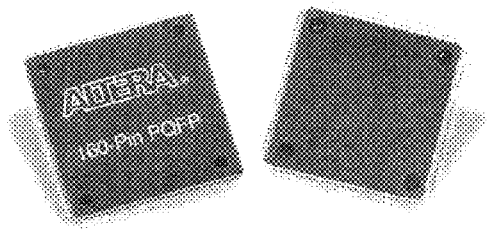
FIG. 8 is a perspective view of a prior art Quad Flat Package (QFP)
Figure 9:
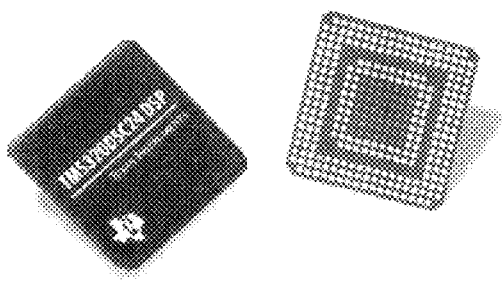
FIG. 9 is a perspective view of a prior art Ball Grid Array (BGA).

FIG. 7 is a cross-sectional view of the apparatus of the present invention illustrating the novel structure which reduces wirebond parasitics for applications utilizing wire-compatible devices. Reduction in wirebond parasitics may be achieved by having EMI shield 740 plane located at a controlled distance 742 from wirebond loops. By adjusting controlled distance 742, wirebond inductance and capacitance may be adjusted for optimal electrical performance.

Since other modifications and changes varied to fit particular operating conditions and environments or designs will be apparent to those skilled in the art, the invention is not considered limited to the examples chosen for purposes of disclosure, and covers changes and modifications which do not constitute departures from the true scope of this invention.

Having thus described the invention, what is desired to be protected by letters patents is presented in the subsequently appended claims.

What is claimed is:

1. A multichip electronic packaging structure, comprising:
    a) a planar substrate having an upper surface, a lower surface and a predetermined coefficient of thermal expansion;
    b) an array of flexible, electrically conductive interconnect members perforating said substrate and extending from said lower surface thereof, a predetermined portion of said extending, flexible interconnect members being surrounded by a dielectric material thereby forming a core, the distal ends of said flexible interconnect members furthest from said lower surface of said substrate being exposed;
    c) a shell in contact with said lower surface of said substrate and surrounding the perimeter of said core;
    d) a planar interconnection layer having an upper surface and a lower surface, said lower surface of said interconnection layer being electrically communicative with said array of interconnect members and affixed to said upper surface of said substrate; and
    e) at least one device electrically and mechanically connected to said upper surface of said interconnection layer;

whereby said exposed ends form a compliant, conductive, demountable interface adapted for connecting said at least one electrical device to an external substrate.

2. The multichip electronic packaging structure as recited in claim 1, wherein said shell is thermally conductive and heat in said substrate is conducted by said shell to said external substrate.

3. The multichip electronic packaging structure as recited in claim 2, wherein said predetermined coefficient of thermal expansion is determined by at least one factor from the group: substrate material, core polymer material, shell material and shell thickness.

4. The multichip electronic packaging structure as recited in claim 3, wherein said predetermined coefficient of thermal expansion is chosen for compatibility with the heat generated by said at least one electrical device so as to operate said at least one electrical device within a predetermined temperature range.

5. The multichip electronic packaging structure as recited in claim 3, wherein at least one conductor of said array of flexible, electrically conductive interconnect members has a diameter different from other conductors of said array.

6. The multichip electronic packaging structure as recited in claim 5, wherein at least one conductor of said array of flexible, electrically conductive interconnect members has a construction from the group: braided, stranded and solid.

7. The multichip electronic packaging structure as recited in claim 3, wherein each conductor of said array of flexible, electrically conductive interconnect members has substantially the same diameter.

8. The multichip electronic packaging structure as recited in claim 7, wherein at least one conductor of said array of flexible, electrically conductive interconnect members has a construction from the group: braided, stranded and solid.

9. The multichip electronic packaging structure as recited in claim 2, wherein said thermally conductive shell comprises a material from the group: metal, sintered ceramics, and composite material.

10. The multichip electronic packaging structure as recited in claim 9, wherein said material is chosen to have a predetermined EMI shielding characteristic.

11. The multichip electronic packaging structure as recited in claim 9, further comprising:
   f) encapsulating material placed over said at least one electrical device within said shell.

12. The multichip electronic packaging structure as recited in claim 11, further comprising:
   g) a package cover disposed over said at least one electrical device and said encapsulating material.

13. The multichip electronic packaging structure as recited in claim 12, wherein said encapsulating material is chosen to have a high thermal conductivity.

14. The multichip electronic packaging structure as recited in claim 13, wherein said at least one electrical device comprises a semiconductor device.

15. The multichip electronic packaging structure as recited in claim 14, wherein said semiconductor device comprises at least one from the group: bare die, packaged semiconductor.

16. The multichip electronic packaging structure as recited in claim 8, wherein said encapsulating material substantially fills said package cover.

17. The multichip electronic packaging structure as recited in claim 16, further comprising:
   h) an EMI shielding structure proximate said at least one electrical device and at a predetermined, critical distance from said package cover and operatively connected to at least one conductor of said array of flexible interconnect members.

18. The multichip electronic packaging structure as recited in claim 17, wherein said EMI shielding structure comprises an EMI shield plane and said predetermined, critical distance is adjusted such that wirebond inductance and capacitance can be adjusted for optimal electrical performance.

19. The multichip electronic packaging structure as recited in claim 16, further comprising:
   h) a thermally conductive shim disposed between said package cover and said at least one electrical device for conducting heat from said at least one electrical device to said package cover.

20. The multichip electronic packaging structure as recited in claim 1, wherein said lower surface of said planar interconnection layer is affixed to said upper surface of said substrate by an adhesive.

21. The multichip electronic packaging structure as recited in claim 20, wherein said adhesive comprises at least one from the group: polymer, Z-axis anisotropic adhesive and conductive epoxy.

* * * * *